(12) United States Patent
Wu et al.

(10) Patent No.: US 9,081,149 B2
(45) Date of Patent: Jul. 14, 2015

(54) METHOD, OPTICAL MODULE AND AUTO-FOCUSING SYSTEM FOR WAFER EDGE EXPOSURE

(75) Inventors: Qiang Wu, Beijing (CN); Yiming Gu, Beijing (CN)

(73) Assignee: SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 684 days.

(21) Appl. No.: 13/441,838

(22) Filed: Apr. 6, 2012

(65) Prior Publication Data

US 2013/0083305 A1    Apr. 4, 2013

(30) Foreign Application Priority Data

Sep. 29, 2011    (CN) .......................... 2011 1 0295452

(51) Int. Cl.
| | | |
|---|---|---|
| G03B 27/34 | (2006.01) | |
| G02B 7/32 | (2006.01) | |
| G02B 7/36 | (2006.01) | |
| G03F 7/20 | (2006.01) | |

(52) U.S. Cl.
CPC .. *G02B 7/32* (2013.01); *G02B 7/36* (2013.01); *G03F 7/2028* (2013.01)

(58) Field of Classification Search
CPC ........... G03F 7/2028; G03F 7/20; G02B 7/32; G02B 7/36; G02B 27/09; G02B 7/28
USPC .......................................................... 355/56
See application file for complete search history.

(56) References Cited

U.S. PATENT DOCUMENTS

| | | | |
|---|---|---|---|
| 4,910,549 A | | 3/1990 | Sugita |
| 5,028,955 A | * | 7/1991 | Hayashida et al. ............. 355/53 |
| 5,168,304 A | * | 12/1992 | Hattori .............................. 355/50 |
| 5,361,121 A | * | 11/1994 | Hattori et al. ................... 355/50 |
| 5,880,816 A | * | 3/1999 | Mimura et al. .................. 355/53 |
| 5,929,976 A | * | 7/1999 | Shibuya et al. ................. 355/53 |
| 5,982,474 A | * | 11/1999 | Akiyama et al. ................ 355/53 |
| 6,214,441 B1 | | 4/2001 | Liu et al. |
| 6,618,118 B2 | * | 9/2003 | Minnaert et al. ................ 355/30 |
| 7,012,702 B2 | * | 3/2006 | Fujiwara et al. .............. 356/614 |
| 2004/0169869 A1 | * | 9/2004 | Shin et al. ...................... 356/635 |
| 2006/0055910 A1 | * | 3/2006 | Lee ................................. 355/72 |
| 2008/0160457 A1 | * | 7/2008 | Collins et al. ................. 430/322 |

(Continued)

FOREIGN PATENT DOCUMENTS

| | | |
|---|---|---|
| CN | 1862387 A | 11/2006 |
| CN | 102147572 A | 8/2011 |

(Continued)

*Primary Examiner* — Deoram Persaud
(74) *Attorney, Agent, or Firm* — Innovation Counsel LLP

(57) ABSTRACT

Embodiments relate to a method, optical module and auto-focusing system for wafer edge exposure. The optical module comprises a light source emitting light of a wavelength to expose a photoresist, an exposing optics and a mask with an aperture between the light source and the exposing optics. The light emitted from the light source passes through the mask and then reaches the exposing optics to image the aperture on the wafer edge covered with the photoresist to form a focused light spot. The positions of the light source, the mask and the exposing optics, and the size of the aperture are configured such that the optical axis of the incident light is perpendicular to the wafer surface, and the light spot completely covers the wafer edge in the radial direction of the wafer.

18 Claims, 3 Drawing Sheets

(56) References Cited

U.S. PATENT DOCUMENTS

2008/0204685 A1* 8/2008 Kono et al. ............... 355/53
2011/0168672 A1* 7/2011 Harte et al. ............... 216/65

FOREIGN PATENT DOCUMENTS

| JP | 08031730 A | * | 2/1996 | ............ H01L 21/027 |
| KR | 100632628 | * | 10/2006 | ............ H01L 21/027 |

* cited by examiner

METHOD, OPTICAL MODULE AND AUTO-FOCUSING SYSTEM FOR WAFER EDGE EXPOSURE

CROSS-REFERENCES TO RELATED APPLICATIONS

This application claims priority to Chinese Patent Application No. 201110295452.3, filed on Sep. 29, 2011 and entitled "METHOD, OPTICAL MODULE AND AUTO-FOCUSING SYSTEM FOR WAFER EDGE EXPOSURE", which is incorporated herein by reference in its entirety.

BACKGROUND OF THE INVENTION

1. Field of the Invention

The present invention relates to a method and device for removing the photoresist on the wafer edge, particularly to a method, optics and an auto-focusing system for removing the photoresist on the wafer edge more accurately by using wafer edge exposure.

2. Description of the Related Art

Smaller and smaller characteristic dimensions are desired by the rapidly developed micro-electronics industry, and the shrinking of characteristic dimensions relies upon photolithography processes to a great extent.

A photolithography process mainly comprises the following steps: coating with a photoresist, exposure and development of the photoresist, wherein as the first step of the photolithography process, the quality of coating of a photoresist has a direct impact on the yield of subsequent processes. With respect to photoresist coating, it is necessary for the layer of a photoresist coated on a wafer to have uniform thickness, which is generally realized by spin coating in the prior art. Spin coating is a procedure, in which a wafer is fixed on the rotating shaft of a spin coating stage and is coated with a photoresist as it is rotated, uniformly spreading the photoresist on the surface of the wafer by centrifugal force. Although the photoresist layer formed by spin coating may have uniform thickness over the central area (also called "effective area") of the wafer, photoresist accumulation tends to occur at the edge area of the wafer, which is called edge bead. Photoresist accumulated on a wafer edge is liable to chip off and thereby causes particles in subsequent processes (e.g., baking), affecting the pattern transfer of the central area, and preventing formation of good patterns. Furthermore, photoresist accumulation may incur problems such as stage contamination. Hence, an edge bead removal process is generally employed to remove the photoresist on the wafer edge after the photoresist coating.

There are two kinds of common processes for edge bead removal, one is chemical method in which an amount of a solvent is dispensed on both sides of the wafer and is so controlled as not to reach the central area of the wafer. However, edge bead removal by this chemical method results in a relatively rough edge, which has a low spatial resolution of about 0.5-1 mm. Another method is optical method, that is, wafer edge exposure (WEE), in which after the photoresist coating, a pattern is transferred onto the photoresist on the wafer edge by the projection of a pattern defining element (such as, a mask with an aperture) on the wafer edge, as shown in FIG. 1. After the pattern exposure on the wafer edge is completed, the photoresist on the wafer edge is removed by a development process. As compared to the chemical method, the width and position of edge bead to be removed can be controlled more precisely, and improved spatial resolution can be realized by the optical method. However, since the projection of the pattern defining element may lead to a blurring edge of about 50 μm, a transition region of a considerable width where photoresist is partially removed still retains after the edge bead removal by the optical method. Such a transition region is liable to introduce defects, reducing yield of the process consequently.

Therefore, it is desired to provide a method and device capable of removing photoresist on a wafer edge more precisely.

BRIEF SUMMARY OF THE INVENTION

The inventor of the present invention has found that there are problems in the prior art and thus proposes novel technical solutions to address at least one of those problems.

According to a first aspect of the present invention, there is provided an optical module for wafer edge exposure. The optical module includes a light source, a mask with an aperture, and an exposing optics, wherein the light source is used to emit light of a wavelength required to expose a photoresist. The mask is positioned between the light source and the exposing optics, light emitted from the light source passes through the mask and then reaches the exposing optics, the exposing optics is used to image the aperture on the wafer edge coated with the photoresist to form a focused light spot. The respective positions of the light source, the mask and the exposing optics and the size of the aperture are configured such that the optical axis of the incident light is perpendicular to the wafer surface, and the light spot completely covers the wafer edge in a radial direction of the wafer.

In an embodiment, the exposing optics comprises a lens or a set of lenses.

In an embodiment, the optical module further comprises a beam homogenizer arranged between the light source and the mask, wherein the light emitted from the light source is turned into a light beam with uniform intensity distribution by the beam homogenizer and then is irradiated on the mask.

According to a second aspect of the present invention, there is provided a method for wafer edge exposure by means of an optical module that may include a light source, a mask with an aperture and exposing optics. The method includes disposing the mask between the light source and the exposing optics, and emitting a light of a wavelength required to expose a photoresist by the light source; the light emitted from the light source passing through the aperture of the mask and then reaching the exposing optics. The method also includes imaging the aperture on the wafer edge covered with the photoresist by the exposing optics to form a focused light spot; and configuring the positions of the light source, the mask and the exposing optics and the size of the aperture such that the optical axis of the incident light is perpendicular to the wafer surface, and the light spot completely covers the wafer edge in the radial direction of the wafer.

In an embodiment, the method further comprises rotating the wafer to expose the whole wafer edge with the focused light spot, and removing the photoresist on the whole wafer edge by a development process.

In an embodiment, the method further comprises turning the light emitted from the light source into a beam of light with uniform intensity distribution by a beam homogenizer and irradiating the light on the mask.

According to a third aspect of the present invention, there is provided an auto-focusing system for wafer edge exposure that may include an optical module, a control module, and an optical path adjusting module. The optical module comprises a light source used for emitting light of a wavelength required to expose a photoresist, a first mask with a first aperture, a first optics and a second optics, wherein the light emitted from the light source passes through the first mask, the first optics and the second optics in sequence and then reaches the wafer edge; the first optics is used for directing the light coming from the first aperture of the first mask to the second optics; and the second optics is used for imaging the first aperture on the wafer edge coated with a photoresist to form a light spot. The positions of the light source, the first aperture of the first mask, the first optics and second optics in the optical module and a size of the first aperture are configured such that the optical axis of the incident light is perpendicular to the wafer surface, and the light spot completely covers the wafer edge in the radial direction of the wafer.

The optical module further comprises a second mask having a second aperture and a photodetector. The second aperture of the second mask and the first aperture of the first mask are arranged in mirror symmetry with respect to a semi-reflecting surface of the first optics and are of a same size, wherein the light reflected from the wafer edge passes through the second optics and then is directed to the second mask by the first optics. The photodetector is arranged on a side of the second mask opposite to the side on which the first optics is arranged, for collecting the light entering the second aperture of the second mask and then outputting a corresponding light intensity signal. The position of the second mask is configured such that a first light intensity signal outputted from the photodetector when the light spot is in focus is larger than a light intensity signal outputted from the photodetector when the light spot is out of focus.

The control module is used for outputting a control signal when the light intensity signal outputted from the photodetector is lower than the first light intensity signal. The optical path adjusting module comprises a first optical path adjusting mechanism attached to the optical module for adjusting the tilt of the optical module with respect to the horizontal plane in response to the control signal from the control module, such that the optical axis of the incident light is perpendicular to the wafer surface; and a second optical path adjusting mechanism attached to the optical module for adjusting the position of the optical module in the direction perpendicular to the wafer surface according to the control signal from the control module, such that the light spot is in focus.

In an embodiment, the second optical path adjusting mechanism comprises a translation member, a solenoid and a ferromagnetic shaft, and the position of the ferromagnetic shaft is adjusted by adjusting the magnitude of a current flowing through the solenoid, so as to move the optical module along the translation member.

In an embodiment, the second optical path adjusting mechanism comprises a translation member and a stepping motor, and the optical module is moved along the translation member by adjusting a screw rod of the stepping motor.

In an embodiment, the first optics comprises a beam splitter.

In an embodiment, the second optics comprises a lens or a set of lenses.

In an embodiment, the optical module further comprises a beam homogenizer arranged between the light source and the first mask, wherein the light emitted from the light source is turned into a light beam with uniform intensity distribution by the beam homogenizer.

In an embodiment, the control module is configured to output a signal for increasing a driving current of the light source, so as to increase the light intensity of the light source.

In an embodiment, the light source, the photodetector and the second optical path adjusting mechanism are connected to the control module through cables.

In an embodiment, the photodetector is a two-dimensional array detector.

In an embodiment, the photodetector is a two-dimensional array of charge coupled device detectors or CMOS detectors.

In an embodiment, the two-dimensional array detector is at least a 2×2 array.

In an embodiment, the optical path adjusting module further comprises a support mechanism having a backing plate, a top plate and a spring.

According to a fourth aspect of the present invention, there is provided a method for wafer edge exposure by means of an auto-focusing system. The auto-focusing system comprises an optical module, a control module and an optical path adjusting module. The optical module includes a light source, a first mask with a first aperture, a second mask with a second aperture, a first optics, a second optics and a photodetector. The optical path adjusting module includes a first optical path adjusting mechanism and a second optical path adjusting mechanism, which are attached to the optical module. The method comprises emitting a light of a wavelength required to expose a photoresist from the light source; the light emitted from the light source being incident on the first optics after passing through the first mask; directing the light coming from the first aperture of the first mask to the second optics by the first optics, and imaging the first aperture on the wafer edge coated with a photoresist by the second optics to form a light spot.

The method further comprises configuring the positions of the light source, the first aperture of the first mask, the first optics and second optics in the optical module and the size of the first aperture, such that an optical axis of an incident light is perpendicular to the wafer surface, and the light spot completely covers the wafer edge in the radial direction of the wafer; the light incident on the wafer edge being reflected by the wafer edge and the reflected light passing through the second optics and the first optics in sequence. The method also comprises directing the light coming from the second optics to the second mask by the first optics; collecting the light travelling through the second aperture of the second mask and outputting a corresponding light intensity signal by the photodetector; and configuring the position and size of the second aperture of the second mask, such that the second aperture of the second mask and the first aperture of the first mask are arranged in mirror symmetry with respect to a semi-reflecting surface of the first optics and are of the same size, wherein, a first light intensity signal outputted from the photodetector when the light spot is in focus is larger than a light intensity signal outputted from the photodetector when the light spot is out of focus.

In addition, the method comprises outputting a control signal to a second optical path adjusting mechanism of the optical adjusting module by the control module, when the light intensity signal outputted from the photodetector is lower than the first light intensity signal; and adjusting the position of the optical module in a direction perpendicular to the wafer surface according to the control signal by the second optical path adjusting mechanism, such that the light spot is in focus.

In an embodiment, the method further comprises rotating the wafer to expose the entire wafer edge with the focused light spot and removing the photoresist on the entire wafer edge by a development process.

In an embodiment, the method further comprises turning the light emitted from the light source into a beam of light with uniform intensity distribution by a beam homogenizer and irradiating the light on the first mask.

In an embodiment, the method further comprises outputting a signal for increasing a driving current of the light source by the control module, so as to increase a light intensity of the light source.

In an embodiment, the method further comprises adjusting the tilt of the optical module with respect to the horizontal plane by the first optical path adjusting mechanism, such that the optical axis of the incident light is perpendicular to the wafer surface.

In an embodiment, adjusting the tilt of the optical module with respect to the horizontal plane comprises: detecting the reflected light with an array detector, and determining whether the optical axis of the incident light is perpendicular to the wafer surface based on the distribution symmetry of the reflected light over the array detector.

Embodiments of the present invention provide many benefits such that the photoresist on a wafer edge can be removed more precisely and spatial resolution can be improved, thereby increasing the process yield.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention will be more clearly understood from the following detailed description with reference to accompanying drawings, wherein.

DETAILED DESCRIPTION OF THE INVENTION

Figure 1:
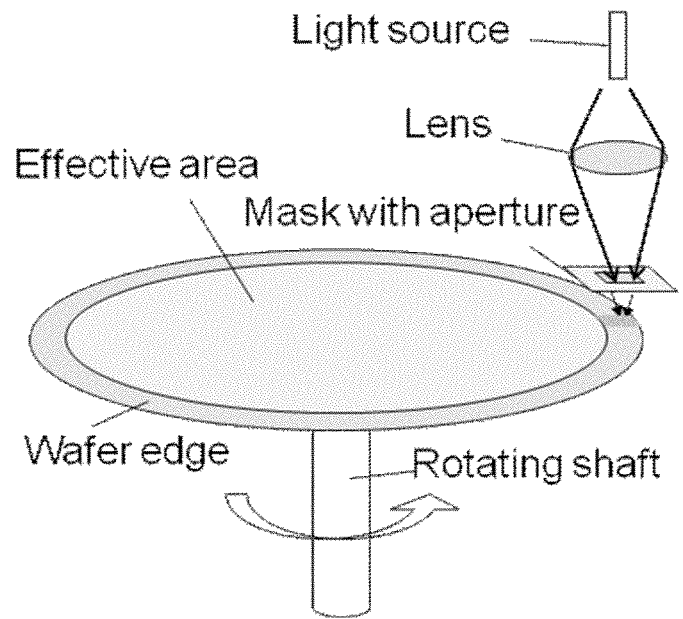
FIG. 1 is a diagram showing a system for wafer edge exposure in the prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that for the simplicity of description, each part in these figures may not be drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 2:
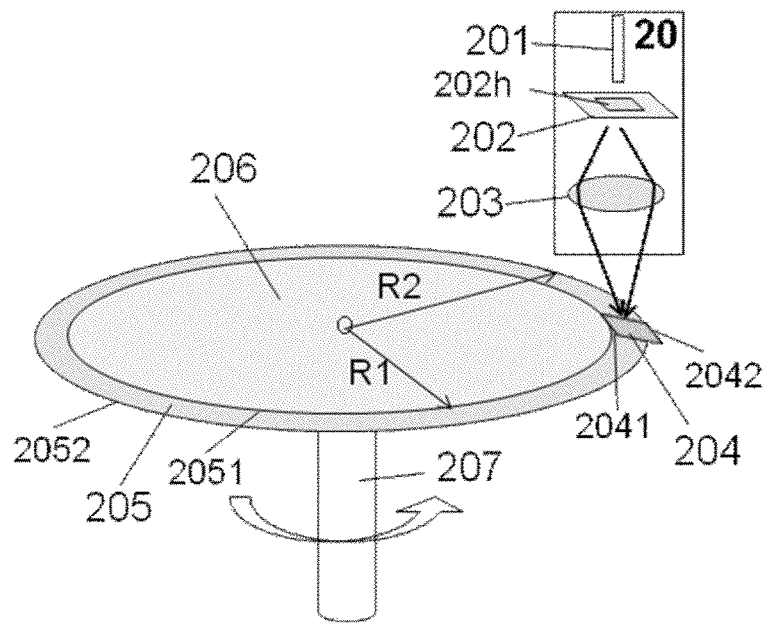
FIG. 2 is a diagram of implementing wafer edge exposure using an optical module according to a first embodiment of this invention.

FIG. 2 is a diagram of implementing wafer edge exposure using an optical module 20 according to a first embodiment of this invention.

As shown in FIG. 2, a layer of photoresist formed on the surface of a wafer through spin coating by means of a rotating shaft 207 comprises two areas, that is, a central area 206 (also called "effective area") and an edge area 205 of the wafer. The wafer central area 206 is a circle region having uniform thickness and a centre O on the wafer surface. The wafer edge 205 is a circle ring defined by an inner circle 2051 and an outer circle 2052, which is concentric with the central area 206. Edge bead is formed by the photoresist accumulation on the wafer edge 205. The optical module 20 of the first embodiment of this invention can be used to remove wafer edge through wafer edge exposure.

The optical module 20 may comprise a light source 201, a mask 202 and an exposing optics 203. The light source 201 is used to emit a light of a wavelength required to exposure the photoresist. The mask 202 has an aperture of a certain size, and is disposed between the light source 201 and the exposing optics 203.

A beam homogenizer (not shown) can be disposed between the light source 201 and the mask 202, such that the light emitted from the light source 201 is turned into a light beam having uniform intensity distribution by the beam homogenizer and then is irradiated on the mask 202.

The light emitted from the light source 201 passes through the aperture 202h of the mask 202 and then reaches the exposing optics 203.

The exposing optics 203 is used to form an image of the aperture on the wafer edge 205 covered with the photoresist to form a focused light spot 204. The exposing optics 203 can be a lens or a set of lens.

As shown in FIG. 2, the positions of light source 201, mask 202 and exposing optics 203 are configured such that the optical axis of the incident light is perpendicular to the wafer surface, and the side 2041 of the spot 204 closer to the wafer centre is tangent to the inner circle 2051 of the wafer edge 205.

In addition, the size of aperture 202h is configured such that the wafer edge is completely covered by the light spot 204 in the radial direction of the wafer, that is to say, the light spot 204 has a size in the radial direction of the wafer larger then or equal to the size of the wafer edge 205 in the radial direction of the wafer (i.e., the difference between the radius R2 of the outer circle 2052 and the radius R1 of the inner circle 2051 of the wafer edge 205). In the case of a spot of equal size, the side 2042 of the light spot 204 far away from the wafer circle centre is also tangent to the outer circle 2052 of the wafer edge 205; while in the case of a larger spot, the side 2042 of the light spot 204 far away from the wafer circle centre extents beyond the outer circle 2052 of the wafer edge 205.

Therefore, the whole wafer edge can be exposed with the focused light spot by rotating the wafer, and the photoresist on the whole wafer edge can be removed by a development process.

The spatial resolution and focus depth can be evaluated by the following Expression (1) using the optical module according to this invention to perform wafer edge exposure.

$$\text{spatial resolution} = \frac{\lambda}{2NA} \quad (1)$$

$$\text{focus depth} = \frac{\lambda}{8\sin^2\frac{\theta}{2}}$$

wherein NA=sin θ.

Numerical aperture NA is determined from the required optical spatial resolution and focus depth using Expression 1. Therefore, those skilled in the art can select an appropriate NA as required. According to the above Expression 1, spatial resolution can be improved and a proper focus depth is guaranteed to reduce disadvantageous affects on spatial resolution due to the rotation of the wafer and the non-uniformity of wafer thickness by selecting an appropriate NA.

For example, with respect to an incident light having a wavelength of 200 nm, if NA is selected as 0.05, the spatial resolution is 2 μm, which is far better than that of 50 μm in the prior art. In this case, the focus depth is 40 μm, which is roughly the same as or larger than the thickness variation of the wafer, such that the optical module can be controlled to reduce the disadvantageous affects on spatial resolution due to the rotation of the wafer and the non-uniformity of wafer thickness.

Although the positions of the optical module 20 and the wafer edge can be originally configured to keep the light spot 204 in focus, it is possible for the light spot 204 to move away from the in focus state to an out of focus state, due to the rotation of the wafer and the non-uniformity of wafer thickness. Therefore, in order to ensure high resolution of edge bead removal, it is necessary to adjust timely the position of the optical module to keep the light spot in focus.

Figure 3:
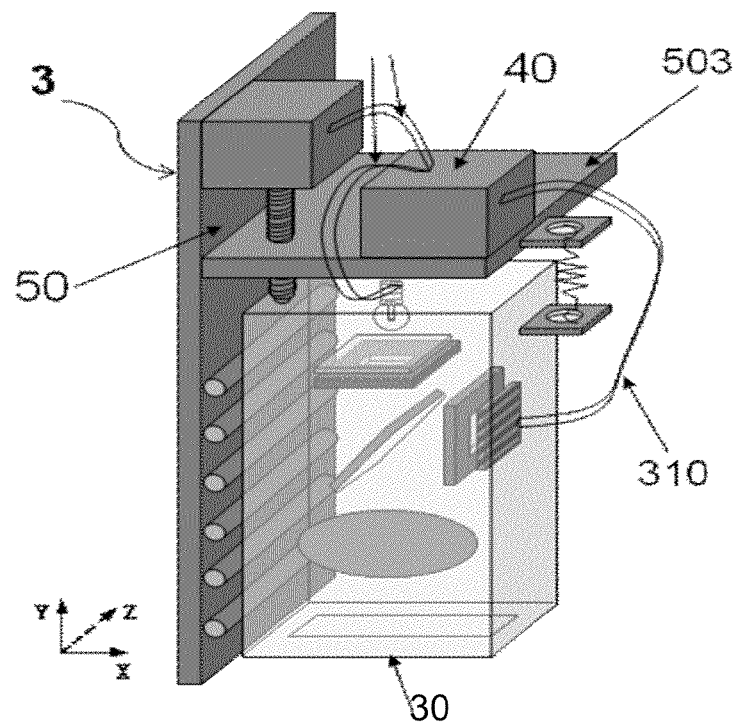
FIG. 3 is a diagram showing an auto-focusing system according to a second embodiment of this invention.

FIG. 3 is a diagram showing an auto-focusing system 3 according to a second embodiment of this invention.

As shown in FIG. 3, the auto-focusing system 3 comprises an optical module 30, a control module 40 and an optical path adjusting module 50. The auto-focusing system 3 further comprises a connection member 310 (e.g., cables) for connecting the optical module, the control module and the optical path adjusting module.

Figure 4:
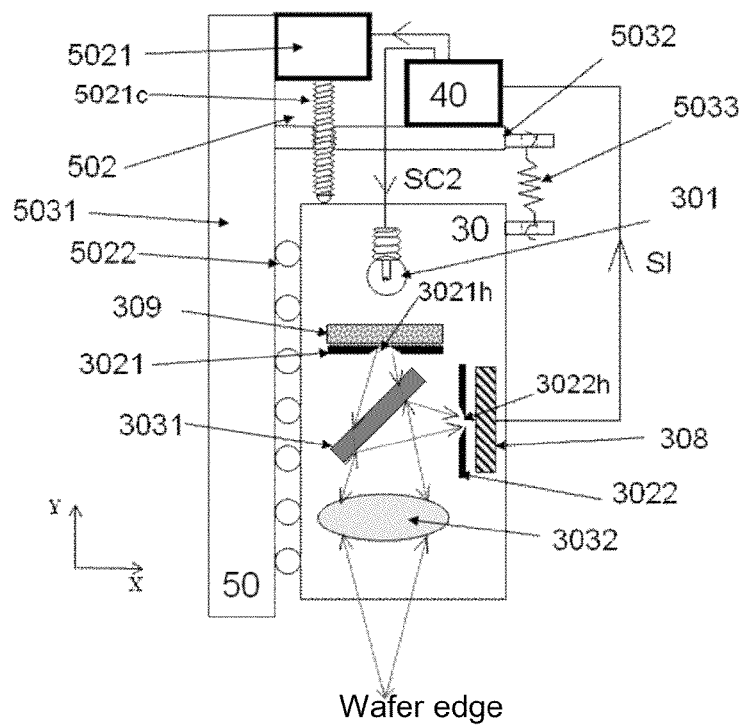
FIG. 4 is a cross section view showing the auto-focusing system of FIG. 3 in detail.

FIG. 4 is a cross section view along the X and Y directions, showing the auto-focusing system 3 of FIG. 3 in detail. As shown in FIG. 4, the optical module 30 may comprise a light source 301, a first mask with a first aperture 3021h, a second mask with a second aperture 3022h, a first optics 3031, a second optics 3032 and a photodetector 308.

The light source 301 is used to emit a light of a wavelength required to expose a photoresist, and the light emitted from the light source 301 passes through the first mask 3021 at first. A beam homogenizer 309 can also be disposed between the light source 301 and the first mask 3021, such that the light emitted from the light source 301 is turned into a light beam with uniform intensity distribution by the beam homogenizer and then is irradiated on the mask 3021.

The light passing through the first aperture 3021h of the first mask 3021 is incident on the first optics 3031. The first optics 3031 is used to direct the light coming from the first aperture 3021h of the first mask 3021 to the second optics 3032. As shown in FIG. 4, the light travelling through the first aperture 3021h of the first mask 3021 passes through the first optics 3031 and then reaches the second optics 3032. The first optics 3031 can be for example a beam splitter.

The second optics 3032 is used for imaging the first 3021h on the wafer edge coated with a photoresist (corresponding to the wafer edge 205 of FIG. 2, not shown in FIG. 4). The second optics can be, for example, a lens or a set of lenses.

Similarly to FIG. 2, the positions of the light source 301, the first mask 3021, the first optics 3031 and the second optics 3032 in the optical module 30 can also be configured such that the optical axis of the incident light is perpendicular to the wafer surface, and the side of the light spot closer to the wafer centre (corresponding to the 2041 of FIG. 2, not shown in FIG. 4) is tangent to the inner circle of the wafer edge (corresponding to the 2051 of FIG. 2, not shown in FIG. 4).

In addition to the setting of the relative positions of the light source 301, the first mask 3021, the first optics 3031 and the second optics 3032 in the optical module 30, the tilt of the optical module 30 as a whole with respect to the horizontal plane should be adjusted as well to ensure that the optical axis of the incident light is perpendicular to the wafer surface.

The optical path adjusting module 50 comprises a first optical path adjusting mechanism (not shown) and a second optical path adjusting mechanism 502. As shown in FIG. 4, the optical path adjusting module 50 further comprises a support mechanism 503, which may comprise a back plate 5031, a top plate 5032 and a spring 5033. The back plate 5031 is used to support the optical path adjusting module 50. The top plate 5032 is attached to the back plate 5031 for supporting the control module 40. The optical module 30 is attached to the top plate 5032 by the spring 5033.

The first optical path adjusting mechanism of the optical path adjusting module 50 can be attached to the back plate 5031 of the optical module 30 for adjusting the tilt of the optical module 30 with respect to the horizontal plane to ensure that the optical axis of the incident light is perpendicular to the wafer surface.

Furthermore, similarly to that of FIG. 2, the size of aperture 3021h can also be configured such that the wafer edge is completely covered by the light spot in the radial direction of the wafer, that is to say, the light spot 304 has a size in the radial direction of the wafer larger than or equal to the size of the wafer edge in the radial direction of the wafer. In the case of a spot of equal size, the side of the light spot 204 far away from the wafer circle centre (corresponding to the 2042 of FIG. 2, not shown in FIG. 4) is tangent to the outer circle of the wafer edge (corresponding to the 2052 of FIG. 2, not shown in FIG. 4). In the case of a larger spot, the side of the light spot 304 far away from the wafer circle centre extents beyond the outer circle of the wafer edge. Therefore, the wafer edge can be completely covered by the light spot in the radial direction of wafer, while ensuring not covering the effective area of the wafer, and thus the photoresist on the wafer edge can be removed precisely.

As shown in FIG. 4, the light incident on the wafer edge is reflected and then passes through the second optics 3032 and the first optics 3031 in sequence. The first optics 3031 is used to direct the light coming from the second optics 3032 to the second aperture 3022h of the second mask 3022. The second aperture 3022h of the second mask 3022 and the first aperture 3021h of the first mask 3021 are arranged in mirror symmetry with respect to a semi-reflecting surface of the first optics 3031. For example, the virtual image of the second aperture 3022h of the second mask 3022 produced by the reflection of the first optics 3031 can be coincided with the first aperture 3021h of the first mask 3021 in spatial position. In an embodiment, the second aperture 3022h of the second mask 3022 and the first aperture 3021h of the first mask 3021 are of the same size. The light reflected from the wafer edge passes through the second optics 3032 and then reaches the second mask 3022 after the reflection by the first optics 3031.

The photodetector 308 is disposed on the side of the second mask 3022 opposite to the first optics 3031, and is connected to the control module 40 through, for example, a cable 310 (FIG. 3), for receiving the light travelling through the second aperture 3022h of the second mask 3022 and then outputting a corresponding light intensity signal SI to the control module 40. The photodetector can be a two-dimensional array detector (for example, in the Y and Z directions shown in FIG. 3). In an embodiment, the photodetector is a two dimensional array of charge coupled device detectors or CMOS sensing detectors, or other photo sensors. In an embodiment, the two-dimensional array detector is at least a 2×2 array.

Those skilled in the art can adjust the positions of the light source, the first aperture of the first mask and the second aperture of the second mask, the first and second optics and the photodetector, such that the light emitted from the light source and travelling through the first aperture of the first mask is reflected from the first optics and then reaches the second optics, and the light reflected from the wafer edge to the second optics reaches the second mask after passing through the first optics and then is collected by the photodetector.

The position of the second mask 3022 and the size of the second aperture 3022h are configured such that a light intensity signal $SI_{in\_focus}$ outputted from the photodetector 308 when the light spot is in focus is higher than the light intensity signal $SI_{out\_of\_focus}$ outputted from the photodetector 308 when the light spot is out of focus.

For example, the position of the second mask 3022 and the size of the second aperture 3022h are configured such that light directed to the second mask 3022 by the first optics 3031 passes through the second aperture 3022h and is collected by the photodetector 308 when the light spot is in focus; and only a portion of the light directed to the second mask 3022 by the first optics 3031 passes through the second aperture 3022h and is collected by the photodetector 308 when the light spot is out of focus, and the other portion of the light is blocked by the second mask 3022 and thus cannot be collected by the photodetector 308.

As mentioned above, while the positions of the optical module 30 and the wafer edge can be originally set to make the light spot in focus before the operation of the auto-focusing system 3, after the operation of the system, the light spot may be out of focus due to the rotation of the wafer and the non-uniformity of wafer thickness. Therefore, in order to ensure a high resolution of edge bead removal, it is necessary to expose the entire wafer edge with a light spot that is always in focus.

Thus, the control module 40 is used to output a control signal SC based on the light intensity signal SI outputted from the photodetector 308.

The control signal SC may comprise a signal SC1 which is outputted to the second optical path adjusting mechanism 502 for adjusting the position of the optical module 30.

Optionally, the control signal SC may further comprise a signal SC2 which is outputted to the light source 301 for adjusting a driving current of the light source, to increase or stabilize the light intensity of the light source through increasing the driving current in case that the light source may deteriorate due to aging.

Optionally, the control signal SC may further comprise a signal which is outputted to the first optical path adjusting mechanism for adjusting a tilt of the optical module with respect to the horizontal plane.

The first optical path adjusting mechanism determines whether the optical axis of the incident light is perpendicular to the wafer surface based on the symmetry of reflected light distribution over the array detector. For example, when the distribution of the reflected light on the array detector is symmetric with respect to both Y and Z directions, the optical axis of the incident light is considered as being perpendicular to the wafer surface; when the distribution of the reflected light on the array detector is asymmetric with respect to any of Y and Z directions, the optical axis of the incident light is considered as not being perpendicular to the wafer surface. At that time, the tilt of the optical module needs to be adjusted such that the optical axis of the incident light is perpendicular to the wafer surface.

Note that when adjusting the tilt of the optical module with respect to the horizontal plane, the second mask can be removed from the optical path. Besides, when adjusting the tilt of the optical module with respect to the horizontal plane, it is necessary to calibrate the position of the array detector, for example, causing the centre of the array detector to be on the optical axis of the reflected light passing through the first optics (such as a splitter). Such adjustment can be implemented before the operation of the auto-focusing system 3, and no other adjustment is needed after the operation of the auto-focusing system 3.

Both of the photodetector 308 and the light source 301 can be connected to the control module 40 through, for example, a cable 310 (FIG. 3).

When the light intensity signal SI outputted from the photodetector 308 is lower than the light intensity signal $SI_{in\_focus}$, that is, the light spot is out of focus, the control module 40 outputs a control signal SC1 to the optical path adjusting module 50 for adjusting the position of the optical module 30.

The second optical path adjusting mechanism 502 may comprise a stepping motor 5021 and a translation member 5022. According to the control signal SC1 from the control module 40, the second optical path adjusting mechanism 502 adjusts a screw rod 5021c of the stepping motor 5021 in a direction perpendicular to the wafer surface to move the optical module 30 along the translation member 5022, so as to make the light spot in focus again by adjusting the position of the optical module 30, that is, the light intensity signal SI outputted from the photodetector 308 being substantially equal to the light intensity signal $SI_{in\_focus}$.

Thereby, the whole wafer edge can be exposed with the focused light spot by rotating the wafer, and then the photoresist on the wafer edge can be removed through a development process.

Figure 5:
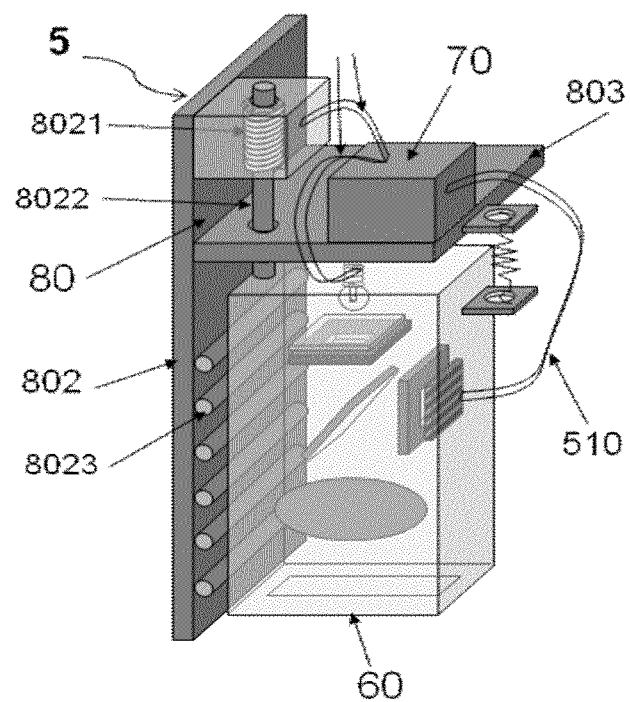
FIG. 5 is a diagram showing an auto-focusing system according to a third embodiment of this invention.

FIG. 5 is a diagram showing an auto-focusing system 5 according to a third embodiment of this invention. As shown in FIG. 5, the auto-focusing system 5 comprises an optical module 60, a control module 70 and an optical path adjusting module 80.

The optical module 60 of the third embodiment of this invention is similar to the optical module 30 shown in FIGS. 3 and 4, the control module 70 is similar to the control module 40 shown in FIGS. 3 and 4, the first optical path adjusting mechanism is similar to the first optical path adjusting mechanism according to the second embodiment, the support mechanism 503 is similar to the support mechanism 803 according to the second embodiment of this invention, and the light source, the second optical path adjusting mechanism and the photodetector of the third embodiment of this invention are also connected to the control module through a cable 510 similar to the cable 310 shown in FIG. 3. Therefore, the corresponding description will be omitted herein for conciseness.

The difference between the auto-focusing system 5 according to the third embodiment of this invention and the auto-focusing system 3 according to the second embodiment of this invention lies in that different second optical path adjusting mechanisms are employed.

As shown in FIG. 5, the second optical path adjusting mechanism may comprise a solenoid 8021, a ferromagnetic shaft 8022 and a translation member 8023, and the position of the ferromagnetic shaft 8022 can be adjusted by adjusting the magnitude of the current flowing through the solenoid 8021, so as to move the optical module 60 along the translation member 8023.

As compared to moving the optical module by adjusting the screw rod of the stepping motor, adjusting the position of the ferromagnetic shaft by adjusting the magnitude of the current flowing through the solenoid may achieve a more precise position adjustment for the optical module, as well as a faster system response time.

Thus, the method, optical module and auto-focusing system for wafer edge exposure according to the present invention have been described in detail. Some details that are well known in the art are not discussed for the purpose of not obscuring the concept of this invention. With the above description, those skilled in the art can thoroughly understand how to implement the technique solutions disclosed herein.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the appended claims therefore should be accorded the broadest interpretation so as to encompass all such modifications and similar arrangements and procedures.

What is claimed is:

1. An auto-focusing system for wafer edge exposure, comprising:
    an optical module, comprising:
        a light source used for emitting light of a wavelength required to expose a photoresist, a first mask with a first aperture;
        a first optics;
        a second optics, wherein the light emitted from the light source passing through the first mask, the first optics, and the second optics in sequence and then reaching the wafer edge; the first optics is used for directing the light coming from the first aperture of the first mask to the second optics; and the second optics is used for imaging the first aperture to form a light spot on the wafer edge coated with a photoresist, and wherein the positions of the light source, the first aperture, the first optics, the second optics in the optical module, and a size of the first aperture are configured such that an optical axis of an incident light is perpendicular to the wafer surface and the light spot is characterized by a width that is equal to or greater than a width of the wafer edge region in a radial direction of the wafer;
    a second mask with a second aperture;
    a photodetector, wherein the second aperture of the second mask and the first aperture of the first mask are arranged in mirror symmetry with respect to a semi-reflecting surface of the first optics and are of a same size, and wherein the light reflected from the wafer edge passes through the second optics and then is directed to the second mask by the first optics, and the photodetector is arranged on a side of the second mask opposite to the side on which the first optics is arranged, for collecting the light entering the second aperture of the second mask and then outputting a corresponding light intensity signal,
        wherein a position of the second mask is configured such that a first light intensity signal outputted from the photodetector when the light spot is in focus is larger than a light intensity signal outputted from the photodetector when the light spot is out of focus;
    a control module for outputting a control signal when the light intensity signal outputted from the photodetector is lower than the first light intensity signal; and
    an optical path adjusting module, comprising:
        a first optical path adjusting mechanism attached to the optical module for adjusting the tilt of the optical module with respect to the horizontal plane according to the control signal from the control module, such that the optical axis of the incident light is perpendicular to the wafer surface; and
        a second optical path adjusting mechanism attached to the optical module for adjusting the position of the optical module in the direction perpendicular to the wafer surface according to the control signal from the control module, such that the light spot is in focus.

2. The auto-focusing system according to claim 1, wherein the second optical path adjusting mechanism comprises:
    a translation member; a solenoid; and
    a ferromagnetic shaft;
    wherein a position of the ferromagnetic shaft is adjusted by adjusting a magnitude of a current flowing through the solenoid, so as to move the optical module along the translation member.

3. The auto-focusing system according to claim 1, wherein the second optical path adjusting mechanism comprises:
    a translation member; and
    a stepping motor including a screw rod;
    wherein the optical module is moved along the translation member by adjusting the screw rod.

4. The auto-focusing system according to claim 1, wherein the first optics comprises a beam splitter.

5. The auto-focusing system according to claim 1, wherein the second optics comprises a lens or a set of lenses.

6. The auto-focusing system according to claim 1, wherein the optical module further comprises a beam homogenizer arranged between the light source and the first mask, wherein the light emitted from the light source is turned into a light beam with uniform intensity distribution by the beam homogenizer.

7. The auto-focusing system according to claim 1, wherein the control module is configured to output a signal for increasing a driving current of the light source, so as to increase the light intensity of the light source.

8. The auto-focusing system according to claim 1, wherein the light source, the photodetector and the second optical path adjusting mechanism are connected to the control module through cables.

9. The auto-focusing system according to claim 1, wherein the photodetector is a two-dimensional array detector.

10. The auto-focusing system according to claim 1, wherein the photodetector is a two-dimensional array of charge coupled device detectors or CMOS detectors.

11. The auto-focusing system according to claim 1, wherein the photodetector is a two-dimensional array detector having at least a 2×2 array.

12. The auto-focusing system according to claim 1, wherein the optical path adjusting module further comprises a support mechanism including a backing plate, a top plate and a spring.

13. A method for wafer edge exposure by means of an auto-focusing system, the auto-focusing system comprising an optical module, a control module, an optical path adjusting module, the optical module comprising a light source, a first mask with a first aperture, a second mask with a second aperture, a first optics, a second optics, and a photodetector; the optical path adjusting module comprising a first optical path adjusting mechanism and a second optical path adjusting mechanism, which are attached to the optical module; the method comprising the following steps:

emitting light of a wavelength configured to expose a photoresist from the light source, causing the light emitted from the light source to pass through the first aperture of the first mask and reaching the first optics;

directing the light coming from the first aperture of the first mask to the second optics by the first optics;

imaging the first aperture on a wafer edge coated with a photoresist by the second optics to form a light spot;

configuring positions of the light source, the first aperture of the first mask, the first and second optics in the optical module, and a size of the first aperture, such that an optical axis of an incident light is perpendicular to a wafer surface, and the light spot is characterized by a width that is equal to or greater than a width of the wafer edge region in a radial direction of the wafer, the incident light on the wafer edge being reflected by the wafer edge and the reflected light passing through the second optics and the first optics in sequence;

directing the light coming from the second optics to the second mask by the first optics;

collecting the light travelling through the second aperture of the second mask and outputting a corresponding light intensity signal by the photodetector;

configuring a position and a size of the second aperture of the second mask, such that the second aperture of the second mask and the first aperture of the first mask are arranged in mirror symmetry with respect to a semi-reflecting surface of the first optics and are of a same size, wherein a first light intensity signal outputted from the photodetector when the light spot is in focus is larger than a light intensity signal outputted from the photodetector when the light spot is out of focus;

outputting a control signal to a second optical path adjusting mechanism of the optical adjusting module by the control module, when the light intensity signal outputted from the photodetector is lower than the first light intensity signal; and adjusting the position of the optical module in a direction perpendicular to the wafer surface in response to the control signal by the second optical path adjusting mechanism, such that the light spot is in focus.

14. The method according to claim 13, further comprising:
rotating the wafer to expose the entire wafer edge with the focused light spot; and
removing the photoresist on the entire wafer edge by a development process.

15. The method according to claim 13, further comprising:
turning the light emitted from the light source into a beam of light having uniform intensity distribution by a beam homogenizer; and
irradiating the first mask.

16. The method according to claim 13, further comprising outputting a signal for increasing a driving current of the light source by the control module, so as to increase a light intensity of the light source.

17. The method according to claim 13, further comprising adjusting a tilt of the optical module with respect to the horizontal plane by the first optical path adjusting mechanism, such that the optical axis of the incident light is perpendicular to the wafer surface.

18. The method according to claim 17, wherein adjusting the tilt of the optical module comprises:
detecting the reflected light with an array detector; and
determining whether the optical axis of the incident light is perpendicular to the wafer surface based on the distribution symmetry of the reflected light over the array detector.

* * * * *